United States Patent [19]

Costantini et al.

[11] 4,454,577

[45] Jun. 12, 1984

[54] LINKED DATA SYSTEMS

[75] Inventors: John J. Costantini, Sommerville; Thomas O. Weilbacker, Northvale; Joseph A. Guglielmo, Rockaway, all of N.J.

[73] Assignee: The Bendix Corporation, Teterboro, N.J.

[21] Appl. No.: 274,951

[22] Filed: Jun. 18, 1981

[51] Int. Cl.³ .......................................... G06F 11/04
[52] U.S. Cl. .................................. 364/200; 364/550; 364/570; 364/580; 364/579
[58] Field of Search ... 364/200 MS File, 900 MS File, 364/579, 580, 570, 550; 340/347 R

[56] References Cited

U.S. PATENT DOCUMENTS

| | | | |
|---|---|---|---|
| 3,585,599 | 6/1971 | Hitt | 364/200 |
| 3,599,161 | 8/1971 | Stoughton | 364/200 |
| 3,731,279 | 5/1973 | Halsall et al. | 364/200 |
| 3,764,995 | 10/1973 | Helf, Jr. et al. | 364/579 |
| 3,940,743 | 2/1976 | Fitzgerald | 364/200 |
| 3,976,979 | 8/1976 | Parkinson et al. | 364/200 |
| 4,155,117 | 5/1979 | Mitchell, Jr. et al. | 364/200 |
| 4,166,290 | 8/1979 | Furtman et al. | 364/200 |
| 4,168,527 | 9/1979 | Winkler | 364/580 |
| 4,181,936 | 1/1980 | Kober | 364/200 |
| 4,219,873 | 8/1980 | Kober | 364/200 |
| 4,231,086 | 10/1980 | Tarbox et al. | 364/200 |

OTHER PUBLICATIONS

IBM Tech. Discl. Bull., vol. 18, No. 8, Jan. 1976; 'Interconnector for Diverse Types of Programmed Apparatus', by Edstrom et al.

*Primary Examiner*—Charles E. Atkinson
*Assistant Examiner*—William G. Niessen
*Attorney, Agent, or Firm*—Anthony F. Cuoco; Thomas L. Adams

[57] ABSTRACT

A link (10) exchanges data between a master (MC) and slave (SC) computer. Each computer has control lines (26A, 42) and incompatible information lines (26B, 26C, CA1-15, CX1-21). The master computer (MC) includes a master interface (28) connected to the information and control lines (26) of the master computer (MC). The master interface (28) has separate intercommunication lines (LA/B) and intermediate (34) lines. This master interface (28) is able to provide an intermediate signal on its intermediate lines (34) in response to signals provided by the master computer (MC) on its control lines (26A). The link (10) includes a computing subsystem (30) and a slave interface (38). The computing subsystem (30) is connected to the intercommunication (LA/B) and intermediate (34) lines of the master interface (28). The computing subsystem (30) has command lines (36) for providing thereon a command signal in response to the intermediate signal. The slave interface (38) is connected to the intercommunication lines (LA/B) of the master interface (28), to the command lines (36) of the computing subsystem (30) and to the control lines (42) of the slave computer (SC). The slave interface (38) can provide a signal to the control lines (42) of the slave computer (SC) in response to the command signal.

16 Claims, 3 Drawing Figures

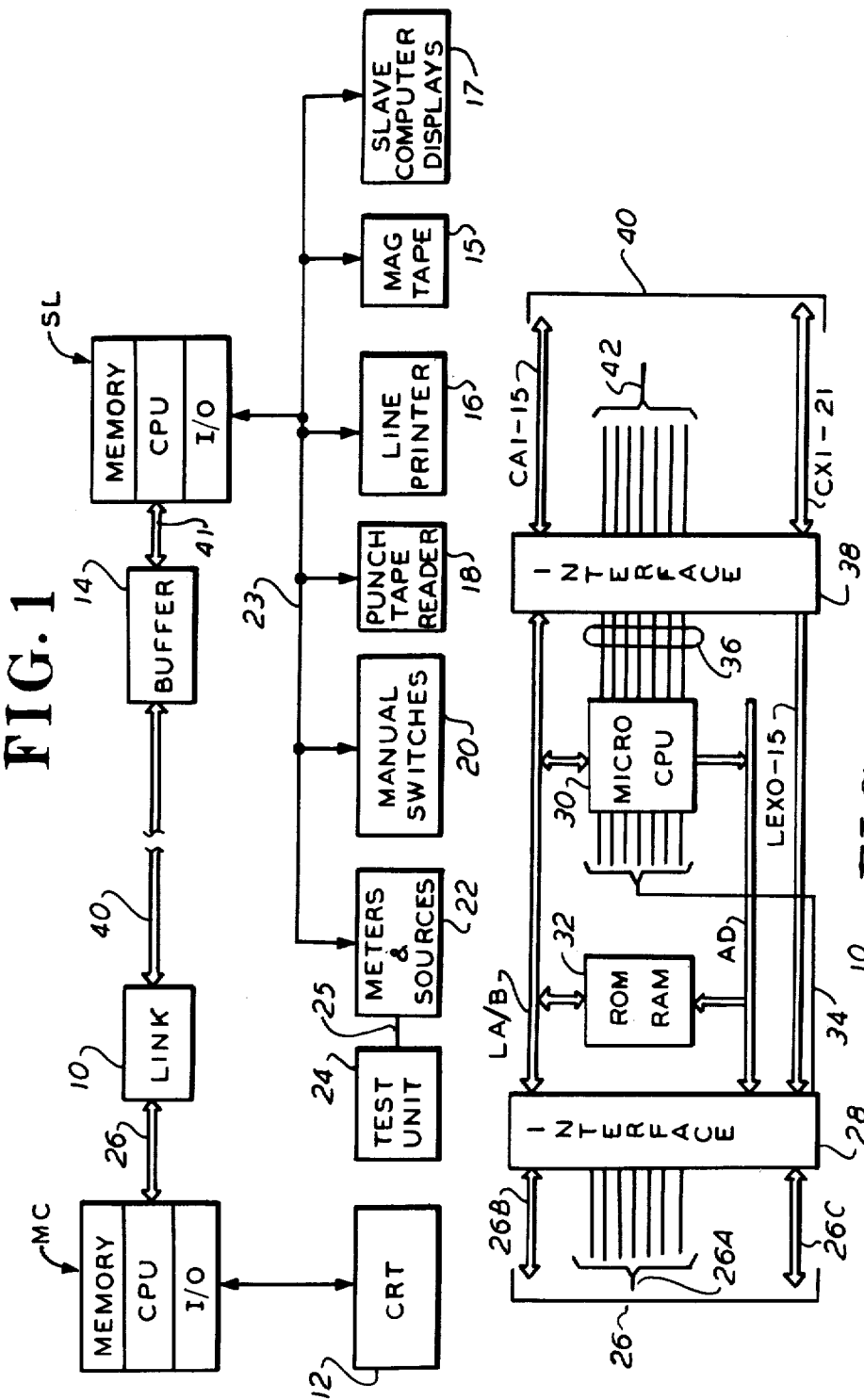

LINKED DATA SYSTEMS

BACKGROUND OF THE INVENTION

The present invention relates to data systems and, in particular, to a slave computer which can be remotely controlled by a master computer.

It is known to employ a computer to control various equipment such as test instruments for monitoring a test unit. Such systems have included peripherals for programming and changing the programming of the computer. For example, a computing system could include a group of parallel bit switches for manually sending single word instructions. These manual switches can cooperate with other control switches for interrupting the computer. Such systems have included teletypewriters having tape readers for originally programming the computer.

A disadvantage with systems of the foregoing type is that reprogramming and debugging can be extremely time consuming because of the tape reader and manual switches employed. Accordingly, there is a need for equipment and methods for operating a testing computer so that its manner of operation can be established simply and changed quickly. Also efficient equipment and methods for interrogating and debugging this testing computer are desired.

SUMMARY OF THE INVENTION

In accordance with the illustrative embodiment demonstrating features and advantages of the present invention, there is provided a link for exchanging data between a master and slave computer. Each computer has control lines and incompatible information lines. The master computer includes a master interface means connected to the information and control lines of the master computer. This master interface means has separate intercommunication lines and intermediate lines. The master interface means can provide an intermediate signal on the intermediate lines in response to signals provided by the master computer on its control lines. The link has a computing means and a slave interface means. The computing means is connected to the intercommunication and intermediate lines of the master interface means. This computing means has command lines for providing thereon a commond signal in response to the intermediate signal. The slave interface means is connected to the intercommunication lines of the master interface means, to the command lines of the computing means and to the control lines of the slave computer. This slave interface means can provide a signal to the control lines of the slave computer in response to the command signal.

Also, in accordance with the present invention, there is provided a method for controlling a slave computer with a master and intermediate computer. The slave, master and intermediate computers each have a plurality of interconnecting lines. The method includes the step of transmitting a halt signal from the master computer through the intermediate computer to the slave computer, to halt operation of the latter. The method also includes the step of transmitting a coded signal from the master computer through the intermediate computer to the slave computer, causing the latter to store part of the coded signal.

By employing equipment and methods of the foregoing type an advantageous data system is provided. A remote slave computer can perform tasks such as operating measuring instruments and stimulative devices for testing a remote unit. The slave computer can be reprogrammed, halted or debugged by a master computer which is linked to the slave through a subsystem including, preferably, a microcomputer. In a preferred embodiment, the microcomputer has a custom interface to the master computer and the slave computer.

The foregoing system can perform numerous functions. For example, the master computer can transmit a program through the link to the slave computer to reprogram it. Also, the master computer can be used for interactive debugging. For example, the master computer can send instructions to the slave causing it to execute one of its programming steps and then pause. The master computer can then read and display various registers or memory cells from the slave computer. In addition, the master computer can change the contents of the slave computer memory at a specified address by transmitting a change order to the slave.

Moreover, for embodiments where the slave computer controls test instruments and stimulative devices, the master computer can instruct the slave to operate its test instruments and stimulative devices in a given manner. The measurements obtained by the instruments can be relayed back to the master computer for display.

In a preferred embodiment, the link between the master and slave employs a microprocessor having its own data and address lines and its own memory. Instructions forwarded from the master computer through its interface are initially received by the microprocessor which then relays the information through a slave interface at a timing and in a format useable by the slave computer. In this preferred embodiment, the microprocessor has its own control lines as does the master and slave computer.

BRIEF DESCRIPTION OF THE DRAWINGS

The above brief description as well as other objects, features and advantages of the present invention will be more fully appreciated by reference to the following detailed description of a presently preferred but nonetheless illustrative embodiment in accordance with the present invention when taken in conjunction with the accompanying drawings wherein:

FIG. 1 is a block diagram of a link between a master and slave computer according to the present invention; and FIG. 2 is a more detailed block diagram of the link of FIG. 1.

DETAILED DESCRIPTION OF THE PREFERRED EMBODIMENT

Figure 3:
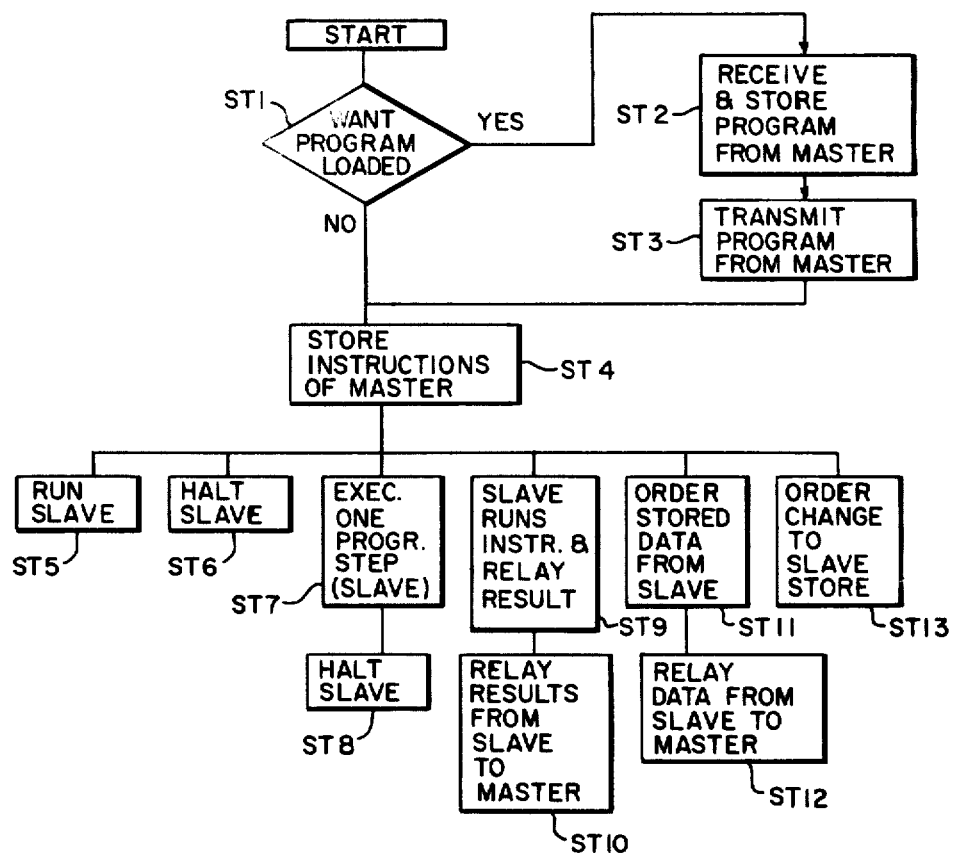
FIG. 3 is a flowchart associated with the link of FIG. 1.

Referring to FIG. 1, link 10 is connected to master computer MC by a plurality of lines 26. Computer MC is a general-purpose computer including as illustrated: data memory, a central processing unit (CPU) and an input/output port (I/O). Master computer MC is shown connected to a display device, in this embodiment, cathode ray tube 12.

Link 10 is arranged to exchange data between master computer MC and slave computer SL. Since slave computer SL is located at a significant distance from link 10 a relatively long cable 40 comprising a plurality of lines connects between link 10 and buffer 14. Buffer 14 employs transmitting and receiving devices for restoring the signal levels that may be attenuated through cable 40. Buffer 14 is shown connecting directly to slave computer SL through a plurality of lines, whose signals correspond to the information on cable 40. Slave computer SL is shown with a slave memory having a plurality of memory cells, a central processing unit (CPU) and an input/output port (I/O). Slave computer SL is shown connected through its input/output port and lines 23 to a plurality of peripherals. Four such peripherals connected to it are conventional line printer 16, punch tape reader 18, magnetic tape memory 15 and computer displays 17. Also connected in this fashion is a manual programmer shown herein as plurality of manual switches 20, one for each relevant bit. Switches 20 can be used to transmit a data word to slave computer SL for the purpose of controlling programming, reprogramming or debugging programs of slave computer SL. Also connected by lines 23 to slave computer SL are a rack of measuring instruments and stimulating devices 22. These measuring instruments may include voltmeters, frequency counters, ammeters, etc. These instruments can be operated by the signals transmitted on lines 23 by slave computer SL to cause instruments 22 to relay back on lines 23 operating parameters measured by them. Instruments 22 connect to a unit under test 24 through a test terminal shown herein as interconnecting lines 25. The stimulating devices in block 22 may include current sources and voltage sources of various types to supply by connector pins or probes in lines 25 stimulating signals to test the performance of unit 24.

Referring to FIG. 2, a more detailed block diagram is given of link 10 of FIG. 1. Previously mentioned lines 26, shown composed of control lines 26A and information lines 26B and 26C, connect to a master interface means 28. Interface 28 may employ a group of registers, flip-flops or other sequential or combinational logic circuits to render lines 26 compatible with the balance of the circuitry shown in FIG. 2. In certain simplified, highly compatible embodiments, interface 28 may be a series of directly wired connections. Interface 28 also connects to a group of intercommunication lines LA/B, a group of intermediate lines 34 and a group of address lines AD. Lines LA/B may carry ordinary data while lines 34 may convey control signals such as halt and interrupt signals.

A computing means, shown herein as processing means 30, connects between data lines LA/B and address lines AD to exchange data with them. In this embodiment, processing means 30 is a conventional microprocessor whose structure and manner of operation is so well known it need not be retold herein. Computing means 30 also includes a memory means, shown herein as a random access and read only memory group 32 connected to data lines LA/B to exchange data therewith and to address lines AD to receive addresses therefrom. Thus arranged, elements 30 and 32 can act as an intermediate microcomputer. Microcomputer 30 is connected to intermediate lines 34 and also to command lines 36 which connect to slave interface means 38. Interface 38 is similar to interface 28 in that it employs various shift registers, flip-flops or other sequential or combinational logic to render lines LA/B, 36 and LEXO-15 compatible with lines 40. Interface 38 connects to data lines LEXO-15 to transmit data along these lines to interface 28. Lines 40 emerging from interface 38 comprise a group of informational lines CA1-15 and CX1-21 of slave computer SL (FIG. 1). Lines 40 also include a group of control lines 42 associated with the slave computer.

The equipment of FIG. 2 can be generally programmed by storing the desired instructions into memory 32 so that data and instructions from the master computer transmitted along lines 26 are received, translated and relayed by microprocessor 30 through interface 38 and lines 40 to control the slave computer in an orderly manner to be described hereinafter in connection with the flow chart of FIG. 3.

To facilitate an understanding of the principles associated with the apparatus of FIGS. 1 and 2, its operation will now be briefly described. A unit under test 24 is initially connected through lines 25 to the measuring and stimulating devices 22. Before starting, if desired (step ST1), programming instructions can be fed into slave computer SL by operating a tape reader 18 or by actuating manual switches 20 to transmit individual programming words. In this mode, slave computer SL can through line printer 16 or display 17 transmit acknowledging responses, inquiries and error signals. However, it is usually simpler for master computer MC to transmit programming information through link 10 and buffer 14.

Because master computer MC is, in this embodiment, a large, general-purpose computer employing many interactive devices such as cathode ray tube 12, initial programming and debugging can be performed more simply and rapidly by dispatching programming instructions from master computer MC. A keyboard associated with cathode ray tube 12 can be used to assemble instructions while its video screen displays the program, as well as, programming errors. Master computer MC transmits this program (step ST2) over lines 26 through interface 28 (FIG. 2). Microcomputer 30 then sends corresponding control signals on lines 34 and address signals on lines AD directing the transmittal (step ST2) of this program along lines LA/B and into memory 32. Subsequently, the program is retransmitted (step ST3) on lines LA/B through interface 38 onto lines CX1-21 to program slave computer SL (FIG. 1).

In the event that the program thus transmitted contains errors, it may be necessary to debug slave computer SL by means of master computer MC. In this case, master computer MC may transmit on control lines 26A (FIG. 2), as well as on information lines 26B and 26C, instructions that cause slave computer SL (FIG. 1) to execute one programming step and then halt (step ST7). Such instructions are conveyed by being first stored temporarily (step ST4) by microprocessor 30 (FIG. 2) in memory 32. Thereafter, these instructions are retransmitted through information lines LA/B and interface 38 to lines 40 for the purpose of controlling slave computer SL (FIG. 1).

It will be appreciated that a halt signal (step ST6) from master computer MC can be conveyed through lines 34 to microprocessor 30 and, thereafter, from the microprocessor control lines 36 through interface 38 to control lines 42. This halt signal can be timed and encoded with the appropriate format to halt the slave computer SL in an orderly fashion.

In a similar fashion, master computer MC (FIG. 1) may be used to troubleshoot a unit 24. The slave computer SL, once programmed, can sequence unit 24 through a series of tests performed by instruments 22 and, thereby, compile data on the responses and operating parameters of unit 24 (step ST5). Thereafter, an inspector may wish to perform additional tests to refine his diagnosis. Accordingly, an inspector may send from master computer MC instructions to operate certain instruments and stimulating devices in rack 22 and return the associated measurements (steps ST9 and ST10), as follows: Instructions are initially conveyed on lines 26 (FIG. 2) through interface 28, microprocessor 30 and interface 38, to lines 40. The instructions thus conveyed are coupled through buffer 14 (FIG. 1) to cause slave computer SL to operate the appropriate instruments and stimulating devices in rack 22 (FIG. 1), perform the requested tests and return on lines 23 the requested measurements. Slave computer SL then conveys this information through buffer 14 and lines 40 to link 10. This returning information is transmitted on information lines CX1-21 through interface 38 (FIG. 2) onto data lines LEX0-15. Thereafter, the information is relayed through interface 28 to master computer MC on lines 26 so they may be displayed on cathode ray tube 12 (FIG. 1).

Another desirable feature provided by the system of FIGS. 1 and 2 is the display and rewriting of information in the memory of slave computer SL. An inspector may transmit from master computer MC an instruction to display data in a memory cell of slave computer SL. Such a request is transmitted through link 10 and buffer 14 (step ST11). In an orderly fashion, slave computer SL returns through buffer 14 and link 10 the requested data which can then be displayed on cathode ray tube 12. If an inspector wishes to change the stored information thus displayed, he can next transmit from master computer MC an appropriate instruction which is conveyed through link 10 and buffer 14 to slave computer SL. This instruction causes the memory of slave computer SL to be rewritten at the selected address (step ST13). The amended information in this memory cell is then relayed back to display 12 to confirm the change.

It is to be appreciated that various modifications may be implemented with respect to the above described preferred embodiment. For example, the information and control lines employed by various computing devices can be changed in number and in the type of signals they carry. It is also expected that alternate microprocessors can be employed which may or may not match the word length in bits used by the master or slave computer. Also, the microprocessor can employ various types of memory devices including combinations of volatile and nonvolatile memories. Moreover, the various interfaces associated with the master and slave computer may employ alternate circuits using various registers, flip-flops or other forms of sequential or combinational logic. In some embodiments, the interface associated with the master computer may be the one typically provided by the manufacturer of the master computer as a standard input/output device. Furthermore, numerous circuit modifications and component substitutions may be implemented to provide the desired speed, word length, capacity, power, signal levels, etc.

Obviously, many modifications and variations of the present invention are possible in light of the above teachings. It is, therefore, to be understood that within the scope of the appended claims, the invention may be practiced otherwise than as specifically described.

What is claimed is:

1. A diagnostic link for exchanging data concerning a unit under test with respect to a programmable, remote, master computer having a plurality of control lines and information lines, said master computer having a master interface means connected to the information and control lines of said master computer, said master interface means having separate intercommunication lines and intermediate lines, said master interface means being operable to provide an intermediate signal on said intermediate lines in response to signals provided by said master computer on its control lines, said link comprising:
   a programmable computing means connected to the intercommunication and intermediate lines of said master interface means, said computing means having command lines for providing, thereon, a command signal in response to said intermediate signal;
   a programmable slave computer having a plurality of control lines and information lines, said information lines of said slave computer being incompatible with the information lines of said master computer, said slave computer containing at least two program steps for immediately consecutive execution by said slave computer without intervention between steps by said computing means; and
   slave interface means connected to the intercommunication lines of said master interface means, to the command lines of said computing means and to the control lines of said slave computer, said slave interface means being operable to provide a signal to the control lines of said slave computer in response to said command signal, said slave computer having a slave program alterable by said computing means and slave interface means to debug said slave program, said computing means comprising:
   processing means for translating and transferring information on the intercommunication lines of said master interface means, said information including at least one slave programming instruction adapted to program said slave computer; and
   memory means for storing information transmitted on the intercommunication lines of said master interface means, said memory means being operable to store said slave programming instruction.

2. A link according to claim 1 wherein said slave interface means is connected to the information lines of said slave computer, and wherein said computing means is operable to relay a computer program through said slave interface means to said slave computer for controlling its operation, at least part of said computer program being temporarily stored in said memory means.

3. A link according to claim 2 wherein said computing means is operable to receive said computer program through the intercommunication lines of said master interface means.

4. A link according to claim 3 wherein the information lines of said master computer are more numerous than the intercommunication lines of said master interface means.

5. A link according to claim 4 wherein said slave computer includes a slave memory having a plurality of memory cells and wherein said computing means is operable to translate and write information into a given one of said memory cells of said slave memory in response to corresponding signals from said master computer being relayed onto said intercommunication lines of said master interface means.

6. A link according to claim 5 wherein said computing means is operable in response to said intermediate signal to interrupt the operation of said slave computer.

7. A link according to claim 6 wherein said computing means is operable through said slave interface means to cause said slave computer to execute a single programming step and pause in response to signals on the intermediate lines of said master interface means.

8. A link according to claim 5 wherein said computing means is operable to transfer and translate information in a given one of said memory cells of said slave memory through said slave and master interface means to said master computer.

9. A link according to claim 1 for analyzing said unit under test wherein said slave computer includes a measuring instrument having a test terminal arranged to be connected to said unit under test for measuring an operating parameter thereof, and wherein said computing means comprises:
    means for transferring through said master and slave interface means to said master computer information obtained by said slave computer from said measuring instrument.

10. A link according to claim 10 wherein said slave computer includes a stimulating device having a probe terminal arranged to be connected to said unit under test for providing an input thereto, and wherein said computing means comprises:
    means for transferring through said master and slave interface means to said slave computer information for operating said device by storing and retransmitting instructions originating from said master computer.

11. A link according to claim 10 wherein said slave computer includes a manual programmer connected to the information lines of said slave computer for manually reprogramming it, said master computer being operable through said computing means to reprogram said slave computer to the same extent as said manual programmer.

12. A link according to claim 1 wherein said slave computer includes a manual programmer connected to the information lines of said slave computer for manually reprogramming it, said master computer being operable through said computing means to reprogram said slave computer to the same extent as said manual programmer.

13. A diagnostic link for testing a unit under test comprising:
    a master computer having a first plurality of information and control lines;
    a slave computer having a second plurality of information and control lines;
    a measuring instrument having a test terminal arranged to be connected to said unit for measuring an operating parameter thereof, said instrument being connected to said slave computer for transmitting requested measurements thereto; and
    a computing means connected between said first and second plurality of lines, said computing means being operable to transfer information from said master to said slave computer to control it and said instrument, said slave computer having a slave program alterable by said computing means to debug said slave program, said slave computer containing at least two program steps for immediately consecutive execution by said slave computer without intervention between steps by said computing means, said computing means comprising:
    processing means for translating and transferring information on said first plurality of lines, said information including at least one slave programming instruction adapted to program said slave computer; and
    memory means for storing information transmitted on said first plurality of lines, said memory means being operable to store said slave programming instruction.

14. A testing method for controlling a slave computer with a master and intermediate computer, said slave, master and intermediate computers each having a plurality of interconnecting lines, said method comprising the steps of:
    transmitting a halt signal from said master computer through said intermediate computer to said slave computer to halt operation of the latter;
    transmitting a coded signal from said master computer to said intermediate computer;
    storing said coded signal in said intermediate computer;
    translating said coded signal into a form acceptable by said slave computer;
    relaying the translated signal from said intermediate computer to said slave computer, causing the latter to store part of said coded signal;
    executing at least two program steps contained in said slave computer in an immediately consecutive fashion and without intervention between steps by said intermediate computer; and
    altering and debugging the program of the slave computer by issuing reprogramming statements from said intermediate and master computers.

15. A method according to claim 14 wherein said slave computer is connected to a measuring instrument to operate it, said method further including the steps of:
    transmitting an interrogate signal from said master computer through said intermediate computer to said slave computer causing the latter to operate said instrument; and
    relaying information gathered by said instrument through said slave and intermediate computers to said master computer.

16. A link for analyzing a unit under test and for exchanging data between a master and slave computer, each having control lines and incompatible information lines, wherein said slave computer includes a manual programmer connected to the information lines of said slave computer for manually reprogramming it, and wherein said slave computer includes a measuring instrument having a test terminal arranged to be connected to said unit under test for measuring an operating parameter thereof, said slave computer including a stimulating device having a probe terminal arranged to be connected to said unit under test for providing an input thereto, said master computer having a master interface means connected to the information and control lines of said master computer, said master interface means having separate intercommunication lines and intermediate lines, said master interface means having means for providing an intermediate signal on said intermediate lines in response to signals provided by said master computer on its control lines, said link comprising:
    a computing means connected to the intercommunication and intermediate lines of said master interface means, said computing means having command lines for providing, thereon, a command signal in response to said intermediate signal, said computing means having means for transferring through said master and slave interface means to said master computer information obtained by said slave computer from said measuring instrument, said computing means having means for transferring through said master and slave interface means to said slave computer information for operating said stimulating device, said master computer having means for reprogramming said slave computer through said computing means to the same extent as said manual programmer; and slave interface means connected to the intercommunication lines of said master interface means, to the command lines of said computing means and to the control lines of said slave computer, said slave interface means having means for providing a signal to the control lines of said slave computer in response to said command signal.

* * * * *

UNITED STATES PATENT AND TRADEMARK OFFICE
CERTIFICATE OF CORRECTION

PATENT NO. : 4,454,577
DATED : June 12, 1984
INVENTOR(S) : Costantini, Weilbacker and Guglielmo It is certified that error appears in the above-identified patent and that said Letters Patent are hereby corrected as shown below:

Column 7, line 21 delete "10" and insert --9-- after "claim"

Signed and Sealed this

Twenty-third Day of October 1984

[SEAL]

Attest:

Attesting Officer

GERALD J. MOSSINGHOFF
Commissioner of Patents and Trademarks